United States Patent
Baek

[11] Patent Number: 6,145,113
[45] Date of Patent: Nov. 7, 2000

[54] SERIES REED-SOLOMON DECODER SYNCHRONIZED WITH BIT CLOCK SIGNAL

[75] Inventor: Jong Sup Baek, Kyoungki-Do, Rep. of Korea

[73] Assignee: Hyundai Electronics Industries Co., Ltd., Rep. of Korea

[21] Appl. No.: 09/143,346

[22] Filed: Aug. 28, 1998

[30] Foreign Application Priority Data

Aug. 30, 1997 [KR] Rep. of Korea ............... 97-45322

[51] Int. Cl.[7] ........................................ H03M 3/17
[52] U.S. Cl. ................................. 714/784; 714/761
[58] Field of Search ........................... 714/761, 762, 714/784

[56] References Cited

U.S. PATENT DOCUMENTS 4,782,490  11/1988  Tenengolts ........................ 371/40
5,659,557   8/1997  Glover et al. ................... 371/37.1

OTHER PUBLICATIONS

Whiting, D., "Bit-Serial Decoders in VLSI", PhD Thesis, Cal. Inst. Tech., pp. 88–121, Dec. 1985.

*Primary Examiner*—Stephen M. Baker
*Attorney, Agent, or Firm*—Blakely Sokoloff Taylor & Zafman

[57] ABSTRACT

The present invention relates to a small size decoder reducing power consumption and more particularly to a series reed-Solomon decoder synchronized with a bit clock signal. In a Reed-Solomon decoder according to the present invention, the syndrome calculation part comprises a classification element for classifying the input coding data into an even data and an odd data and for calculating, in series, coefficient of the syndrome polynomial on bit-by-bit basis, being synchronized with a bit clock signal. The error position and estimation polynomial calculation part comprises a classification element for classifying an initial syndrome polynomial, a correction syndrome polynomial, an initial deletion pointer polynomial and an initial deletion pointer polynomial into an even data and an odd data and for an error value polynomial and an error position value polynomial on bit-by-bit basis, being synchronized with a bit clock signal. The error position polynomial root and error value calculation part comprises a substitution element for substituting roots for the error position polynomial and the error value polynomial, being synchronized with a bit clock signal, for accumulating results of the error position polynomial and the error value polynomial and for outputting error values for error correction, being synchronized with a byte clock signal.

15 Claims, 7 Drawing Sheets

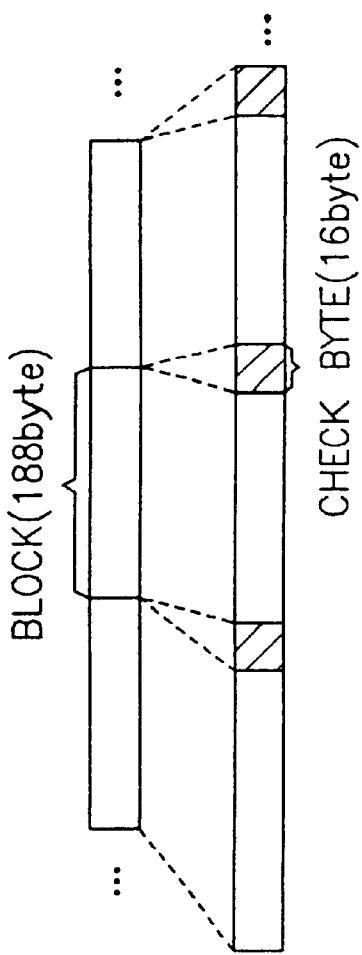
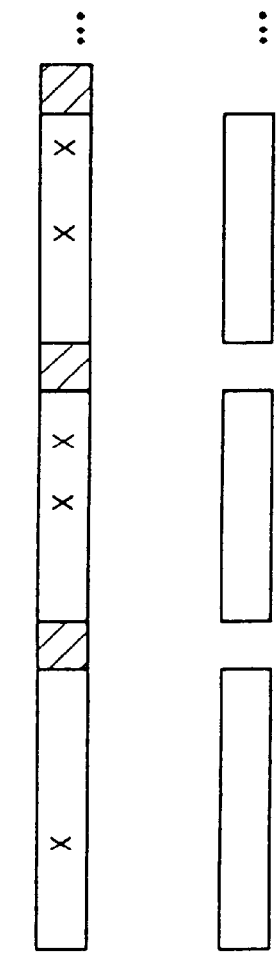
FIG. 1(a) SOURCE ENCODING DATA
(PRIOR ART)
FIG. 1(b) CHANNEL ENCODING DATA
(PRIOR ART)
FIG. 1(c) TRANSMITTED DATA BY CHANNELS
(PRIOR ART)
FIG. 1(d) DECODED DATA
(PRIOR ART)

FIG. 7

| cycle | wk | sk | s0 | $a^{-i}$ | $s_{k,256-i}(a^{-i})$ | $w_{k,256-i}(a^{-i})$ | $s_{odd}(a^{-i})$ | $s(a^{-i})$ | $w(a^{-i})$ |
|---|---|---|---|---|---|---|---|---|---|
| 13 | w1 | s1 | s0 | $a^{-1}$ | $s_{1,203}=s_1(a^{-1})^{52}$ | $w_{1,203}=w_1(a^{-1})^{52}$ | | | |
| 14 | w2 | s2 | s0 | $a^{-2}$ | $s_{2,203}=s_2(a^{-2})^{52}$ | $w_{2,203}=w_2(a^{-2})^{52}$ | | | |
| 15 | w3 | s3 | s0 | $a^{-3}$ | $s_{3,203}=s_3(a^{-3})^{52}$ | $w_{3,203}=w_3(a^{-3})^{52}$ | | | |
| 16 | w4 | s4 | s0 | $a^{-4}$ | $s_{4,203}=s_4(a^{-4})^{52}$ | $w_{4,203}=w_4(a^{-4})^{52}$ | | | |
| 17 | w5 | s5 | s0 | $a^{-5}$ | $s_{5,203}=s_5(a^{-5})^{52}$ | $w_{5,203}=w_5(a^{-5})^{52}$ | | | |
| 18 | w6 | s6 | s0 | $a^{-6}$ | $s_{6,203}=s_6(a^{-6})^{52}$ | $w_{6,203}=w_6(a^{-6})^{52}$ | | | |
| 19 | w7 | s7 | s0 | $a^{-7}$ | $s_{7,203}=s_7(a^{-7})^{52}$ | $w_{7,203}=w_7(a^{-7})^{52}$ | | | |
| 20 | w8 | s8 | s0 | $a^{-8}$ | $s_{8,203}=s_8(a^{-8})^{52}$ | $w_{8,203}=w_8(a^{-8})^{52}$ | | | |
| 21 | x | x | s0 | $a^{-1}$ | $s_{1,202}=s_{1,203}a^{-1}$ | $w_{1,202}=w_{1,203}a^{-1}$ | $s_{odd}(a^{-203})$ | $s(a^{-203})$ | $w(a^{-203})$ |
| 22 | x | x | s0 | $a^{-2}$ | $s_{2,202}=s_{2,203}a^{-2}$ | $w_{2,202}=w_{2,203}a^{-2}$ | | | |
| 23 | x | x | s0 | $a^{-3}$ | $s_{3,202}=s_{3,203}a^{-3}$ | $w_{3,202}=w_{3,203}a^{-3}$ | | | |
| 24 | x | x | s0 | | | | | | |
| 25 | x | x | s0 | $a^{-1}$ | $s_{1,0}=s_{1,1}a^{-1}$ | $w_{1,0}=w_{1,1}a^{-1}$ | $s_{odd}(a^{-1})$ | $s(a^{-1})$ | $w(a^{-1})$ |
| 26 | x | x | s0 | $a^{-2}$ | $s_{2,0}=s_{2,1}a^{-2}$ | $w_{2,0}=w_{2,1}a^{-2}$ | | | |
| 27 | x | x | s0 | $a^{-3}$ | $s_{3,0}=s_{3,1}a^{-3}$ | $w_{3,0}=w_{3,1}a^{-3}$ | | | |
| 28 | x | x | s0 | $a^{-4}$ | $s_{4,0}=s_{4,1}a^{-4}$ | $w_{4,0}=w_{4,1}a^{-4}$ | | | |
| 29 | x | x | s0 | $a^{-5}$ | $s_{5,0}=s_{5,1}a^{-5}$ | $w_{5,0}=w_{5,1}a^{-5}$ | | | |
| 30 | x | x | s0 | $a^{-6}$ | $s_{6,0}=s_{6,1}a^{-6}$ | $w_{6,0}=w_{6,1}a^{-6}$ | | | |
| | x | x | s0 | $a^{-7}$ | $s_{7,0}=s_{7,1}a^{-7}$ | $w_{7,0}=w_{7,1}a^{-7}$ | | | |
| | x | x | s0 | $a^{-8}$ | $s_{8,0}=s_{8,1}a^{-8}$ | $w_{8,0}=w_{8,1}a^{-8}$ | | | |
| | | | | | | | | | |
| | w1 | s1 | s0 | $a^{-1}$ | $s_{1,203}=s_1(a^{-1})^{52}$ | $w_{1,203}=w_1(a^{-1})^{52}$ | $s_{odd}(a^{-1})$ | $s(a^{-1})$ | $w(a^{-1})$ |
| | w2 | s2 | s0 | $a^{-2}$ | $s_{2,203}=s_2(a^{-2})^{52}$ | $w_{2,203}=w_2(a^{-2})^{52}$ | | | |
| | w3 | s3 | s0 | $a^{-3}$ | $s_{3,203}=s_3(a^{-3})^{52}$ | $w_{3,203}=w_3(a^{-3})^{52}$ | | | |

SERIES REED-SOLOMON DECODER SYNCHRONIZED WITH BIT CLOCK SIGNAL

BACKGROUND OF THE INVENTION

1. Field of the Invention

The present invention relates to a small size decoder reducing power consumption and more particularly to a series reed-Solomon decoder synchronized with a bit clock signal.

2. Description of the Related Arts

In typical digital communication systems, the Reed-Solomon decoder has been used for correcting an error generated in signal transmission. For example, the Reed-Solomon decoder has been recently used in the digital video broadcasting.

The Reed-Solomon decoder decodes the coded data on block-by-block basis in order to correct an error. The encoding on block-by-block basis is to divide the input sequential data into a plurality of block of a predetermined length, to code the data by blocks and to add a dummy byte to the end of the coded block data. While this coding on block-by-block basis can correct the transmission errors by adding the dummy byte to it at a decoding part, the dummy byte added to the transmission data causes the channel width to be wider. However, this encoding and decoding on block-by-block basis have been widely used in the data error correction because of the excellent correction ability for the continuous data errors.

FIGS. 1A to 1D are schematic views illustrating conventional encoding and decoding on block-by-block basis. This block encoding data used in the reed-Solomon encoding/decoding apparatus consists of 188 bytes and 16 dummy byte (hereinafter, referred to as check bytes). Accordingly, this invention will describe the block data of 204 bytes as an exemplary.

Referring to FIG. 1A, a source encoding data is divided by unit blocks (188 bytes) before a channel encoding. The channel encoding data has the size of 204 bytes by adding the divided data (188 bytes) to the check byte of 16 bytes, as shown in FIG. 1B. With the encoding on block-by-block basis, the channel extends to 204 bytes from 188 bytes.

Generally, the Reed-Solomon encoding/decoding method carries out the modular operations on the Galore field. The block data M(x) is written according to the procedure as follows:

$$M(x)M_{187}X^{187}+M_{186}X^{186}+\ldots+M_2X^2+M_1X^1+M_0X^0 \quad (1)$$

As shown above Equation 1, the block data is expressed as a polynomial M(x) consisting of specific order related to each byte. That is, the data divided into a plurality of blocks of "order+1". The channel data is obtained by multiplying the lock data M(x) by a 16-order creation polynomial G(x). That is, the 203-order channel encoding data C(x) is obtained by multiplying the 187-order block data by the 16-order creation polynomial, where the coefficients of the block data M(x) are the same as those of the 203-order to 16-order channel encoding data C(x) and the coefficients of the 15-order channel encoding data C(x) and the coefficients of the 15-order to 0-order channel encoding data C(x) relate to the check bytes. By using these check byte, the errors generated in transferring data can be corrected. The channel encoding data C(x) and the creation polynomial G(x) are expressed as follows:

$$C(x) = M(x) \times G(x) = M(x) \times x^{16} + \sum_{i=0}^{15} C_i x^i \quad (2)$$

$$G(x) = \prod_{i=1}^{16}(x+a^i) = \sum_{i=0}^{16} g_i x^i$$

The channel encoding data C(x) is transferred to a decoder in the receiving terminal through a transmission channel with a noise. Therefore, the data input into the decoder of the receiving terminal is a receiving data R(x) which is different from the channel encoding data C(x). The receiving data R(x) is expressed as follows:

$$R(x) = C(x) + E(x) = \sum_{i=0}^{203} R_i x_i \quad (3)$$

As shown in FIG. 1B, the receiving data R(x) may include the error data E(x) and the error data E(x) has random values. As mentioned above, the coding data, to which the check byte of 16 bytes is added, may generally corrects 8 byte errors.

Referring to FIG. 2, the Reed-Solomon decoder for correcting 8 bytes in the erroneous receiving data R(x) will be described. First, the Reed-Solomon decoder includes: a register 21 temporally storing the block data input through the transmission channel until the error values are calculated; a syndrome calculation part 22 for calculating the polynomial to determine whether or not there is an error in the received block data; an error position and estimation polynomial calculation part 23 for determining coefficients of the error position polynomial from the syndrome polynomial of the syndrome calculation part 22 using the Euclid algorithm, thereby calculating the error positions and the estimated polynomial; a error position polynomial root and error value calculation part 24 for calculating roots of the calculated error position polynomial from the error position and estimation polynomial calculation part 23 and then calculating the error values; a control signal generating part 26 for controlling the syndrome calculation part 22, the error position and estimation polynomial calculation part 23 and the error position polynomial root and error value calculation part 24; and an adder 25 for adding the block data stored in the register 21 to the result of the error position polynomial root and error value calculation part 24.

To calculate the error positions and error values form received block data R(x), the syndrome polynomial S(x) having this information should be calculated and the syndrome polynomial S(x) is written as follow:

$$S(x) = \sum_{k=0}^{15} S_k x^{15-k} \quad (4)$$

$$S_k = \sum_{n=0}^{203} R_n a^{nk} \text{ for } 0 \le k \le 15$$

$$a^3 + a^4 + a^3 + a^2 + 1 = 0$$

where $S_k$ is a coefficient value of the syndrome polynomial S(x) and $\alpha$ is a value on the Galore field.

The syndrome polynomial S(x) is composed of 16 coefficients which are the same as the number of the check bytes. That is, the syndrome polynomial S(x) is a 16-order polynomial. The coefficients of the syndrome polynomial S(x) are calculated by blocks so that only one syndrome polynomial S(x) is calculated in only one block data. Therefore, the syndrome calculation part 22 has a latency of 204 bytes, which is a delay time from input to output, and its throughout is 204 bytes.

The Syndrome calculation part 22 obtained by Equation 4 is input into the error position and estimation polynomial calculation part 23 so that an error position polynomial σ(x) and an error value polynomial ω(x) capable of inferring error positions and values are calculated using the Euclid algorithm. The Euclid algorithm can be described mathematically as follows:

$$R_0(x)=A(x), Q_0(x)=S(x), \lambda_0(x)=0, \mu_0(x)=1$$

$$R_i(x)=[\sigma_{i-1}b_{i-1}R_{i-1}(x)+\overline{\sigma_{i-1}}a_{i-1}Q_{i-1}(x)] -x^{\{l_{i-1}\}}[\sigma_{i-1}a_{i-1}Q_{i-1(x)}+\overline{\sigma}b_{i-1}R_{i-1}(x)]$$

$$\lambda_i(x)=[\sigma_{i-1}b_{i-1}\lambda_{i-1}(x)+\overline{\sigma_{i-1}}a_{i-1}\mu_{i-1}(x)] -x^{\{l_{i-1}\}}[\sigma_{i-1}a\sigma_{i-1}\mu_{i-1}(x)+\overline{\sigma}b_{i-1}\lambda_{i-1}(x)]$$

$$Q_{i-1}(x)=[\sigma_{i-1}Q_{i-1}(x)+\overline{\sigma_{i-1}}R_{i-1}(x)]$$

$$\mu_i(x)=[\sigma_{i-1}\mu_{i-1}(x)+\overline{\sigma_{i-1}}\lambda_{i-1}(x)]$$

$$l_{i-1}=\deg(R_{i-1}(x))-\deg(Q_{i-1}(x))$$

$$\sigma_{i-1}=1, \text{ if } l_{i-1} \geq 0$$

$$\sigma_{i-1}=0, \text{ if } l_{i-1} < 0 \qquad (5)$$

where $R_0(x)$ is a reference polynomial which is given within itself, $Q_0(x)$ is a correction syndrome polynomial which is an input of the syndrome polynomial, $\lambda_0(x)$ is a reference polynomial and $\mu_0(x)$ is a deletion pointer polynomial.

The final aim of the Euclid algorithm is to determine the error position polynomial and the error value polynomial. The error position and estimation polynomial calculation part 23 is terminated when the order of the reference polynomial $R_0(x)$ used in the Euclid algorithm is below 8.

In case where there is an error in byte within the block from the error position polynomial and the error value polynomial, the algorithm to eliminate the error is the search algorithm of Chien. In other words, it is determined whether or not there exists an error, by substituting a root corresponding to each byte for the variable in the error position polynomial and the error value polynomial, which are calculated by the Euclid algorithm. If an error exists in it, the value of the error is calculated by the following equation 6:

$$e(a^{-i}) = \frac{w(a^{-i})}{\sigma_{odd}(a^{-i})} \& \text{true}\left\{\sum_{k=0}^{8} \sigma_k(\sigma^{-i}) = 0\right\} \qquad (6)$$

Typically, the input data of the Reed-Solomon decoder is input on block-by-block basis in response to the byte clock. Therefore, in embodying this Reed-Solomon decoder, its operation is carried out by the byte clock. As a result, the conventional Reed-Solomon decoder causes each calculation part to have separate cells, thereby increasing the size of decoder.

SUMMARY OF THE INVENTION

An object of the present invention is to provide a Reed-Solomon decoder synchronized with a bit clock signal in series.

Another object of the present invention is to provide a Reed-Solomon decoder capable of reducing a chip size by implementing calculation parts using only one cell.

Still another object of the present invention is to provide a Reed-Solomon decoder capable of reducing power consumption.

In accordance with the present invention, there is provided a Reed-Solomon decoder including a syndrome calculation part for calculating a syndrome polynomial of an input coding data, an error position and estimation polynomial calculation part for calculating an error value polynomial and an error position polynomial using the syndrome polynomial calculated in the syndrome calculation part, an error position polynomial root and error value calculation part for calculating an error value using the error value and position polynomials calculated in the error position and estimation polynomial, the syndrome calculation part comprising a means for classifying the input coding data into an even data and an odd data and for calculating, in series, coefficient of the syndrome polynomial on bit-by-bit basis, being synchronized with a bit clock signal, the error position and estimation polynomial calculation part comprising a means for classifying an initial syndrome polynomial, a correction syndrome polynomial, an initial deletion pointer polynomial and an initial deletion pointer polynomial into an even data and an odd data and for an error value polynomial and an error position value polynomial on bit-by-bit basis, being synchronized with a bit clock signal, the error position polynomial root and error value calculation part comprising a means for substituting roots for the error position polynomial and the error value polynomial, being synchronized with a bit clock signal, for accumulating results of the error position polynomial and the error value polynomial and for outputting error values for error correction, being synchronized with a byte clock signal.

BRIEF DESCRIPTION OF THE DRAWINGS

A further understanding of the nature and advantage of the present invention will become apparent by reference to the remaining portions of the specification and drawings, in which:

FIGS. 1A to 1D are schematic views illustrating conventional encoding and decoding operation on block-by-block basis;

FIG. 7 is a table Chien's search algorithm according to the present invention.

DETAILED DESCRIPTION OF THE PREFERRED EMBODIMENT

A detailed description of an embodiment according to the present invention will be given below with reference to accompanying drawings.

Generally, in the transmission system, a decoding part at a receiving terminal operates bit by bit before performing the Reed-Solomon decoding. Thus, the Reed-Solomon decoder can operate in response to a bit clock signal. In this case, the operations of all blocks in the conventional Reed-Solomon decoder, which is responsive to the byte clock signal, can be obtained by performing the time division through only one block, i.e., being achieved by repeating the operations eight times. In case where the above decoder is implemented, each processor occupies the chip area of $\frac{1}{8}$, compared with one of the conventional decoder. Also, to carry out the eight time divisions, registers are needed for temporally storing data. This may be implemented by providing shift registers delaying 8 cycles on one chip.

As a result of the reduce of the entire latency, the size of the RAM for delay may be also reduced. If the conventional Reed-Solomon decoder delays the input data for 400 cycles, the Reed-Solomon decoder according to the present invention delays the input data only for 242 cycles. Accordingly, the desired size of the RAM is reduced by $^{242}\!/_{400}$.

Figure 3:
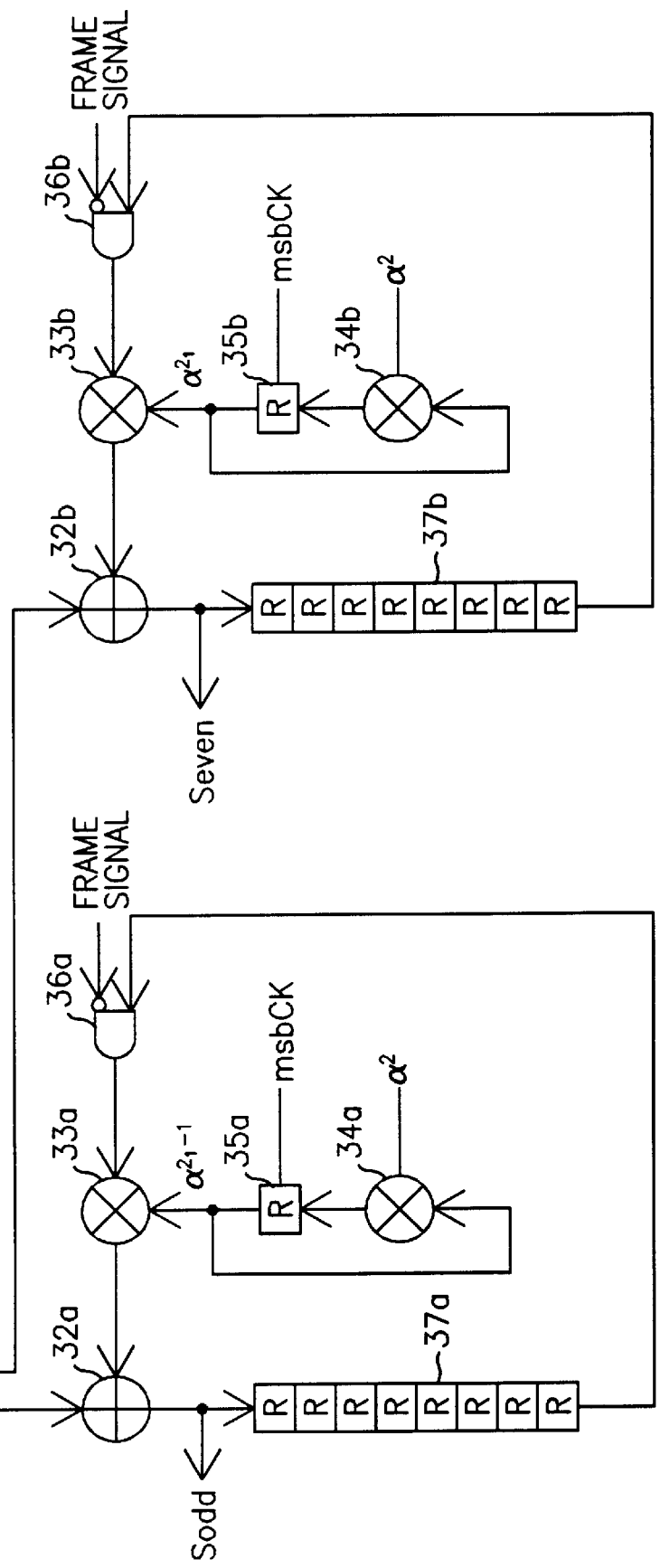
FIG. 3 is a schematic diagram of a syndrome calculation part in accordance with the present invention.
Figure 4:
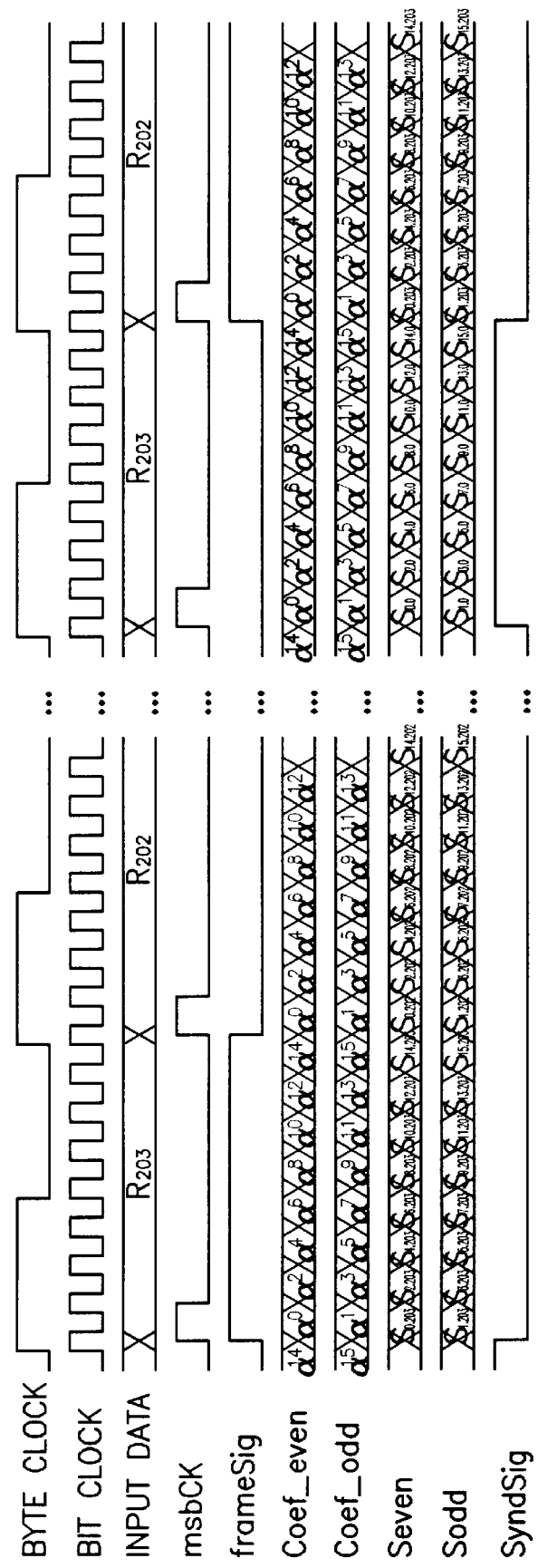
FIG. 4 is a timing chart illustrating the syndrome calculation part in accordance with the present invention.

FIG. 3 is a schematic diagram of a syndrome calculation part in accordance with the present invention and FIG. 4 is a timing chart illustrating the syndrome calculation part in accordance with the present invention. In FIG. 3, the reference numeral 31 denotes a demultiplexer, 32a and 32b denote adders, 33a, 33b, 34a and 34b denote multipliers, 35a and 35b denote registers, 36a and 36b denote AND gates, and 37a and 37b denote shift registers.

The syndrome calculation part, which has been well-known to those skill in the art to which the subject pertains, is also employed in the present invention. However, the syndrome calculation part according to the present invention calculates the syndrome polynomial, by classifying the input data into even data and odd data. Further, the syndrome calculation part according to the present invention is characterized in that the input coding data is in series processed in response to the bit clock signal.

First, the principle of the present invention will be described below. To calculate the syndrome polynomial, the coefficients $S_k$ of the syndrome polynomial can be expressed as follows:

$$S_k(\ldots((r_{203}a^k + r_{202})a^k + r_{201})a^k + \ldots)a^k + r_0) \qquad (7)$$

Equation 7 can be modified based on its module feature as the following Equation:

for (0,203,n++)

$S_{k,n} \leftarrow r_n - S_{k,n-1}\alpha^{15-k}$, for each k, $1 \leq k \leq 15$ $S_{k,n-1} = 0$ $S_{k,203} = S_k \qquad (8)$ Therefore, in the syndrome caculation part, the circuit to obtain the coefficients $S_k$ of the syndrome polynomial is implemented in parallel and Equation 8 should be implemented by one processor because the input data row $r_n$ is input in series. Also, to calculate the syndrome coefficients $S_k$ of the input data row which is input every byte cycles, only two processors are required in order to process the even data and odd data in the present invention, instead of 16 processors required in the prior art. FIG. 3 shows this circuit. The syndrome calculation part according to the present invention has a latency of 204 cycles, and outputs a syndrome polynomial corresponding to the related block polynomial for one cycle every 204 cycles.

Since the calculations for the even data and the odd data are the same, hereinafter, the present invention will describe a syndrome polynomial only for the even data.

First, the coefficients $S_k$ of the syndrome polynomial can be expressed as follows:

$$S_{14} \leftarrow r_n + S_{14}\alpha^1 \quad \text{for } 1 \leq n \leq 203 \qquad (9)$$
$$S_{12} \leftarrow r_n + S_{12}\alpha^3 \quad \text{for } 1 \leq n \leq 203$$
$$S_{10} \leftarrow r_n + S_{10}\alpha^5 \quad \text{for } 1 \leq n \leq 203$$
$$S_8 \leftarrow r_n + S_8\alpha^7 \quad \text{for } 1 \leq n \leq 203$$
$$S_6 \leftarrow r_n + S_6\alpha^9 \quad \text{for } 1 \leq n \leq 203$$
$$S_4 \leftarrow r_n + S_4\alpha^{11} \quad \text{for } 1 \leq n \leq 203$$
$$S_2 \leftarrow r_n + S_2\alpha^{13} \quad \text{for } 1 \leq n \leq 203$$
$$S_0 \leftarrow r_n + S_0\alpha^{15} \quad \text{for } 1 \leq n \leq 203$$

As shown in the above Equation 9, the coefficients $S_k$ of the syndrome polynomial is obtained by multiplying the coefficient values by a fixed constant a in turn. Equation 9 is re-written in the time division manner as follows:

$$\text{for } (n = 203; n = 0; n--) \qquad (10)$$
$$\text{for } (t = 0; t = 7; t++)$$
$$S_{2t,n} = R_n + S_{2t,n+1}\alpha^{2t}$$
$$S_{t,204} = 0$$

As shown in the above Equation 10, "t" is circulated from 0 to 7 for each variable "n", i.e., 8 cycles. The coefficients $S_k$ of the syndrome polynomial corresponding to each "t" is temporally stored in the shift register. As a result, the shift register functions as an element to delay the syndrome coefficients, which is calculated on bit-by-bit basis, for 8 cycles.

Referring now FIGS. 3 and 4, the coding data row, which is input on byte-by-byte basis according to the byte clock signal, is in turn divided into the even data and the odd data by the demultiplexer 31 and tne odd and even data are respectively input into the adders 32a and 32b to calculate the syndrome coefficients.

The fixed constant α, which is predetermined and stored in a memory (not show), is provided to the multipliers 34a and 34b. The multipliers 34a and 34b multiple the fixed constant α from the memory by the previous constant α which was output at the previous bit clock period. The outputs from the multipliers 34a and 34b are stored in the registers 35a and 35b, respectively. The registers 35a and 35b are initialized by msbCK signal indicating the most significant bit. Also, the registers 35a and 35b temporally store the outputs from the multipliers 34a and 34b and output the stored value to the multipliers 33a and 34a and the multipliers 33b and 34b, respectively.

The 8-bit shift registers 37a and 37b receive and shift the syndrome coefficient calculated in the adders 32a and 32b. The value of the initial syndrome coefficient, which is input into the shift registers 37a and 37b, is zero (0). The value of the syndrome coefficient, which is shifted by the 8-bit shift register 37a and 37b, is input into the tow-input AND gate 36a and 36b with an inverted frame signal indicating valid input period for one frame.

The multipliers 33a and 33b calculate each coefficient of the byte data, by multiplying the delayed previous coefficient applied from the AND gates 36a and 36b by the fixed coefficient from the registers 35a and 35b. The calculated coefficient and the bit data in the coding data are added by the adders 32a and 32b so that the syndrome polynomial corresponding to one block data is calculated. Such syndrome polynomials respectively output the even and odd data rows at bit clock of 8 cycles with respect to the block data, being synchronized with a syndrome polynomial enable signal Syndsig.

To calculate the error position polynomial and the error value polynomial from the coefficient of the syndrome polynomial, the Euclid algorithm has been widely used. In the present invention, these polynomials are in series implemented within one processor. Also, to minimize, on the whole, the latency of the Reed-Solomon decoder, the error position and estimation polynomial calculation part according to the present invention is synchronized with the bit clock signal but the byte clock signal.

Figure 5:
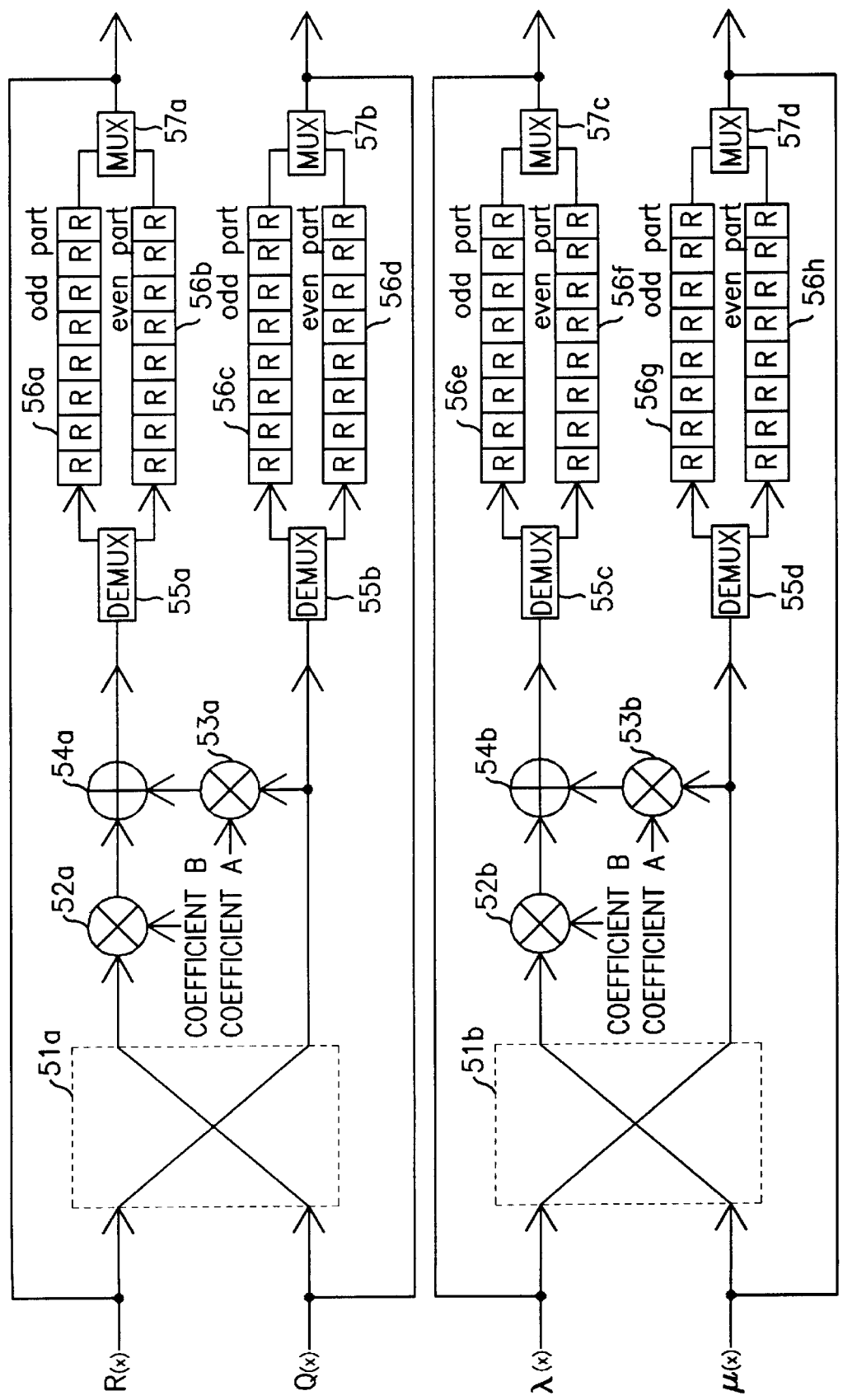
FIG. 5 is a schematic diagram of an error position and estimation polynomial calculation part in accordance with the present invention.

FIG. 5 is a schematic diagram of an error position and estimation polynomial calculation part using the Euclid algorithm in accordance with the present invention. In FIG. 5, the reference numerals 51a and 51b denote crossbar switches, 52a, 52b, 53a and 53b denote multipliers, 54a and 54b denote adders, 55a to 55d denote demultiplexers, 56a to 56f denote shift registers, and 57a to 57d denote multiplexers.

The error position and estimation polynomial calculation part 23 according to the present invention is similar to the conventional one which has been also well-known to those skill in the art to which the subject pertains. However, the error position and error value are respectively calculated in the even data and the odd data and shift registers are provided for the serial process.

The modification of the Euclid algorithm for the serial process can be expressed mathematically as follows:

$$R_0(x) = x^{16}, \; Q_0(x) = \sum_{k=1}^{16} S_k x^{16-k}, \quad (11)$$

$$\lambda_0(x) = 0, \; \mu_0(x) = 1, \; \gamma_0(x) = 1, \; \eta_0(x) = 0$$

$$R_i(x) = \sum_{t=0}^{15} R_{i,t} x^t$$
$$= [\sigma_{i-1} b_{i-1} R_{i-1,t} + \overline{\sigma_{i-1}} a_{i-1} Q_{i-1,t}] -$$
$$x^{|l_{i-1}|} [\sigma_{i-1} a_{i-1} Q_{i-1,t} + \overline{\sigma_{i-1}} b_{i-1} R_{i-1,t}]$$

$$\lambda_i(x) = \sum_{t=0}^{15} \lambda_{i,t} x^t$$
$$= [\sigma_{i-1} b_{i-1} \lambda_{i-1,t} + \overline{\sigma_{i-1}} a_{i-1} \mu_{i-1,t}] -$$
$$x^{|l_{i-1}|} [\sigma_{i-1} a_{i-1} \mu_{i-1} + \overline{\sigma_{i-1}} b_{i-1} \lambda_{i-1,t}]$$

$$Q_i(x) = \sum_{t=0}^{15} Q_{i,t} = \sigma_{i-1} Q_{i-1,t} + \overline{\sigma_{i-1}} R_{i-1,t}$$

$$\mu_i(x) = \sum_{t=0}^{15} \mu_{i,t} = \sigma_{i-1} \mu_{i-1,t} + \overline{\sigma_{i-1}} \lambda_{i-1,t}$$

$$l_{i-1} = \max(t, R_{i-1,t}) - \max(t, Q_{i-1,t})$$

$$\sigma_{i-1} = \text{true} \, (l_{i-1} \geq 0)$$

The circuitry designed base on the above Equation 11, i.e., the error position and estimation polynomial calculation part 23 according to the present invention, is shown in FIG. 5. In FIG. 5, R(x) is an initial syndrome polynomial, Q(x) is a correction syndrome polynomial to reprocess the syndrome polynomial, λ(x) is an initial deletion pointer polynomial, and μ(x) is a deletion pointer polynomial. The coefficients A and B are respectively operated by separate operator every blocks. Since the calculation of the coefficients A and B has been well-known to ordinary skill in the art, the detailed description is omitted. Further, the correction syndrome polynomial Q(x) and the deletion pointer polynomial p(x) are produced by the syndrome calculation part and the initial syndrome polynomial R(x) and the initial deletion pointer polynomial λ(x) are produced by its own operator (not shown).

The error position and estimation polynomial calculation part, which corresponds to each polynomial, includes an operator for calculating the error values and the error position and needs eight shift registers for individually operating even data and odd data.

Similar to general circuits, the crossbar switches 51a and. 51b selectively output either the initial syndrome polynomial R(x) and the correction syndrome polynomial Q(x) or the initial deletion pointer polynomial λ(x) and the deletion pointer polynomial μ(x) in response to a control signal produced by a control signal generator.

Figure 2:
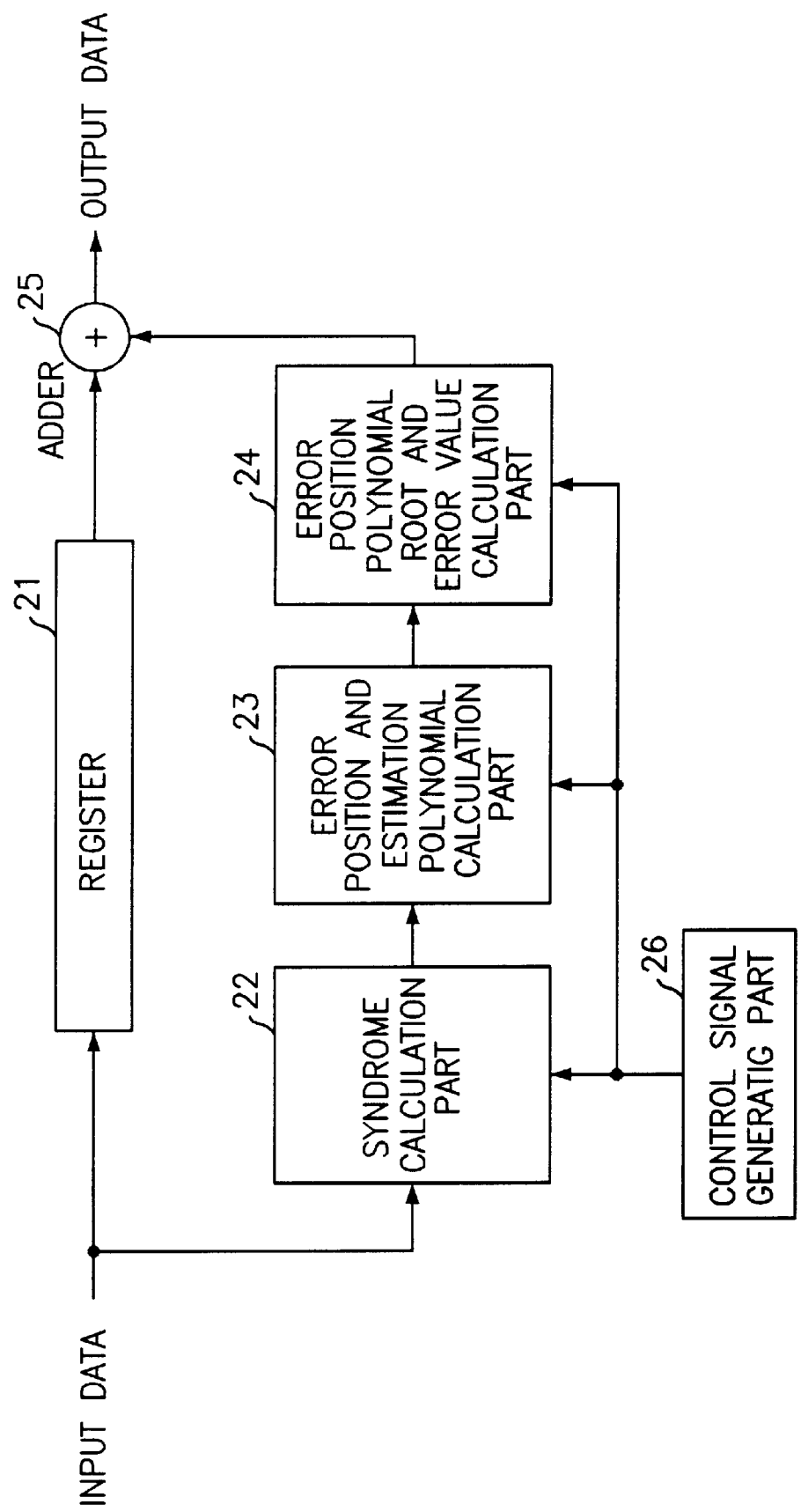
FIG. 2, is a schematic diagram of a Reed-Solomon decoder.

The multipliers 52a and 52b multiply the coefficient B by an output from the crossbar switches 51a and 51b, respectively. Also, the multipliers 53a and 53b multiply the coefficient A by another output from the crossbar switches 51a and 51b, respectively. The adders 54a and 54b add the outputs from the multipliers 52a and 52b to the outputs from the multipliers 53a and 53b, respectively. The output signals from the adders 54a and 54b are divided into the even data and the odd data through the demultiplexers 55a and 55c, respectively, and the divided data is applied to the shift registers 56a, 56b, 56e and 56f. Likewise, another output from the crossbar switches Sla and 51b are divided into the even data and the odd data through the demultiplexers 55b and 55d, respectively, and the divided data is applied to the shift registers 56c, 56d, 56g and 56h. These shift registers 56a to 56h shift the input signals and then output the 8-bit shifted signals. The outputs from the shift register pair storing the even data and the odd data are selected by the multiplexers 57a to 57d. The output from each of the multiplexers 57a to 57d is fed back into the crossbar switches 51a and 51b and the output as an error value polynomial and an error position polynomial is input into the error position polynomial root and error value calculation part 24 of FIG. 2.

The error position polynomial root and error value calculation part 24 receiving the error position polynomial and the error value polynomial uses the search algorithm of Chien in order to obtain the error values and the error positions. That is, the error position polynomial root and error value calculation part 24 substitutes a root corresponding to each error position for the variable in the error position polynomial and the error value polynomial and determines whether or not the calculated result is a root of the error position. If the result is the desired root, the error position polynomial root and error value calculation part 24 calculates the error value, by substituting the calculated root for the variable in the error value polynomial.

According to the present invention, the error position polynomial root and error value calculation part 24 uses a substitution method in the serial construction to determine whether the root corresponds to the related order and is synchronized with the byte clock signal at the time of the error correction. The reason why the synchronization with the byte clock signal is performed is that the data to be corrected is based on the byte unit. The operation of the error position polynomial root and error value calculation part 24 to correct the error values is written as follows:

$$\text{for}(n = 203; n = 0; n--) \quad (12)$$
$$\text{for}(t = 0; t = 7; t++)$$
$$\begin{cases} \sigma_{t,n+1}\sigma^{-t}, \sigma_{t,204} = \sigma_t \\ \omega_{t,n+1}\omega^{-t}, \omega_{t,204} = \omega_t \end{cases}$$

$$\begin{cases} \omega(a^{-i}) = \sum_{t=1}^{t=8} \omega_{t,i} \\ \sigma(\sigma^{-i}) = \sum_{t=0}^{t=8} \sigma_{t,i} \\ \sigma_{odd}(a^{-i}) = \sum_{\substack{t=2X-1 \\ X=1}}^{X=4} \sigma_{t,i} \\ e(a^{-i}) = \begin{cases} \text{if } (\sigma(a^{-i}) = 0), \dfrac{\omega(a^{-i})}{\sigma_{odd}(a^{-i})} \\ \text{if } (\sigma(a^{-i}) \neq 0), 0 \end{cases} \end{cases} \quad (13)$$

Figure 6:
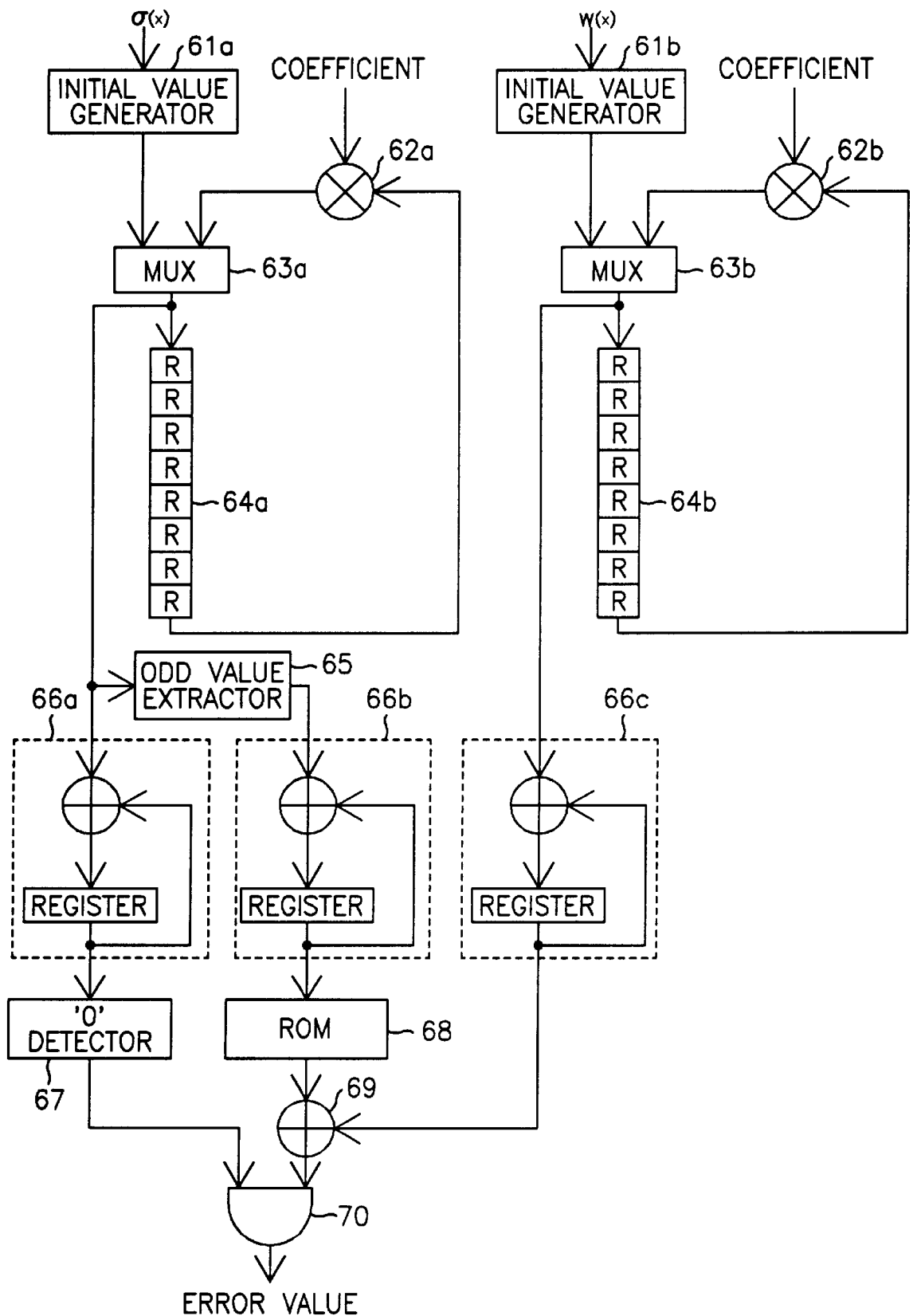
FIG. 6 is a schematic diagram of an error position polynomial root and error value calculation part in accordance with the present invention.

FIG. 6 is a schematic diagram of the error position polynomial root and error value calculation part in accordance with the present invention. In FIG. 6, the reference numerals 61a and 61b denote initial value generators, 62a and 62b denote multipliers, 63a and 63b denote multiplexers, 64a and 64b denote 8-bit shift registers, 65 denotes an odd value extractor, 66a to 66c denote accumulators, 67 denotes zero value detector, 68 denotes a ROM, 69 denotes an adder, and 70 denotes an AND gate.

The initial value generators 61a and 61b make the error position polynomial σ(x) and the error value polynomial ω(x) have 256 bytes. The multiplexers 63a and 63b selectively output the data from the initial value generators 61a and 61b, respectively, and thereafter selectively output the results from the multipliers 62a and 62b during 8 bits on bit-by-bit basis in order to calculate the values for each bit through the multipliers 62 and 62b.

The outputs of the multiplexers 63a and 63b are respectively applied to the 8-bit shift registers 64a and 64b. The 8-bit shift registers 64a and 64b shift the input data by 8 bits so that the shifted input data are provided the multipliers 62a and 62b in turn. The multipliers 62a and 62b multiply the fixed coefficient by the shifted data.

After separately performing the operation to calculate the error values and the error position, the output from the multiplexer 63a, in the error position operation, is applied to the odd value extractor 65 and the accumulator 66a. The odd value extractor 65 extracts only the odd value of the output from the multiplexer 63a and the extracted odd values are accumulated in the accumulator 66b on byte-by-byte basis. On the other hand, the accumulator 66a also accumulates the input data on byte-by-byte basis. Likewise, the output of the multiplexer 63b, in the error value operation, is accumulated in the accumulator 66c on byte-by-byte basis. Those accumulators are made up of registers and adders.

The zero detector 67 detects "0" value of data output from the accumulator 66a and the ROM 68 inverts the output data from the accumulator 66b and stores the inverted data. Further, the ROM 68 has 256×8 size for fractional calculation.

The output from the accumulator c, which is accumulated in the error value operation, and the output of the ROM 68 are added by the adder 69. The error value is output by ANDing the output from the zero detector 67 and the output from the adder 69.

In this Reed-Solomon decoder, in the case whose the number of corrected errors is less than 8, it is possible to know how many the errors are, however, in the case where it is more than 8, a frame error signal is produced.

In Chien's algorithm modified into a serial algorithm, the variation of data according to time is shown in FIG. 7.

As apparent from the above, the Reed-Solomon decoder decreases the chip size with the reduction of the power consumption.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A Reed-Solomon decoder including a syndrome calculation part for calculating a syndrome polynomial of an input coding data, an error position and estimation polynomial calculation part for calculating an error value polynomial and an error position polynomial using the syndrome polynomial calculated in the syndrome calculation part, an error position polynomial root and error value calculation part for calculating an error value using the error value and position polynomials calculated in the error position and estimation polynomial, the syndrome calculation part comprising:
a means for classifying the input coding data into an even data and an odd data and for calculating, in series, coefficient of the syndrome polynomial on bit-by-bit basis, being synchronized with a bit clock signal;

the error position and estimation polynomial calculation part comprising:
a means for classifying an initial syndrome polynomial, a correction syndrome polynomial, an initial deletion pointer polynomial and an initial deletion pointer polynomial into an even data and an odd data and for an error value polynomial and an error position value polynomial on bit-by-bit basis, being synchronized with a bit clock signal;

the error position polynomial root and error value calculation part comprising:
a means for substituting roots for the error position polynomial and the error value polynomial, being synchronized with a bit clock signal, for accumulating results of the error position polynomial and the error value polynomial and for outputting error values for error correction, being synchronized with a byte clock signal.

2. The Reed-Solomon decoder in accordance with claim 1, wherein the syndrome calculation part comprises:
a demultiplexer for classifying the input coding data into the even data and the odd data;
an operating means for calculating the syndrome polynomial by adding a syndrome coefficient to an output form the demultiplexer; and
a delay means for providing the syndrome coefficient to the operating means in turn, being synchronized with a bit clock signal.

3. The Reed-Solomon decoder in accordance with claim 2, wherein the delay means is a shift register.

4. The Reed-Solomon decoder in accordance with claim 2, wherein the operating means comprises:
an ANDing means for receiving an output from the delay means and an inverted frame signal from an external circuit;
a constant operating means for providing a fixed constant corresponding to each bit on byte-by-byte basis;
a multiplier for multiplying an output from the ANDing means by an output from the constant operating means; and an adding means for adding an output from the multiplier to an output from the demultiplexer.

5. The Reed-Solomon decoder in accordance with claim 1, wherein the error position and estimation polynomial calculation part comprises a first operating means for calculating the error value polynomial and a second operating means for calculating the error position polynomial, each of the first and second operating means comprising:
a plurality of delay means for, in turn, delaying coefficients of the error value polynomial and the error position polynomial, which are calculated according to the initial polynomial and the polynomial of the syndrome calculating part, for each of the even and odd bit data, in response to a bit clock signal.

6. The Reed-Solomon decoder in accordance with claim 5, wherein the plurality of delay means has eight delay elements.

7. The Reed-Solomon decoder in accordance with claim 5, wherein the delay means is a 8-bit shift register.

8. The Reed-Solomon decoder in accordance with claim 1, wherein the error position polynomial root and error value calculation part comprises a first operating means for calculating roots of the error positions using the error position polynomial and a second operating means for calculating error values using the error value polynomial, each of the first and second operating means comprising a delay means for delaying the data in order to substitute the coefficients for the error position polynomial and the error value polynomial in turn.

9. The Reed-Solomon decoder in accordance with claim 8, wherein the first operating means comprises:

an initial value generating means for making an output of the error position polynomial have 256 bytes;

a selecting means for selecting one of an output from the initial value generating means and a substitution value for an error position corresponding to each bit;

a delay means for delaying, in turn, an output from the selecting means according to a bit clock signal;

a multiplier for multiplying an output from the delay means by the fixed coefficient and providing the multiplication result;

an extracting means for extracting odd values from outputs from the selecting means;

a first accumulating means for accumulating outputs from the extracting means and outputting the accumulated values on byte-by-byte basis;

a second accumulating means for accumulating outputs from the selecting means and outputting the accumulated values on byte-by-byte basis;

a zero detecting means for detecting logic "0" values of outputs from the selecting means;

a storing means for inverting and storing an output from the first accumulating means;

an adding means for adding an error value provided by the second operating means to an output from the storing means; and an ANDing means for receiving an output from the adding means and an output from the zero detecting means.

10. The Reed-Solomon decoder in accordance with claim 8, wherein the delay means is a 8-bit shift register.

11. The Reed-Solomon decoder in accordance with claim 9, wherein the storing means is a 256×8 sized memory.

12. The Reed-Solomon decoder in accordance with claim 10, wherein the first and second accumulating means comprises:

an adder for adding a new data to a previous data; and a register for temporally storing an output from the adder.

13. The Reed-Solomon decoder in accordance with claim 8, wherein the error position polynomial root and error value calculation part comprises:

an initial value generating means for making an output of the error position polynomial have 256 bytes;

a selecting means for selecting one of an output from the initial value generating means and a substitution value for an error position corresponding to each bit;

a delay means for delaying, in turn, an output from the selecting means according to a bit clock signal;

a multiplier for multiplying an output from the delay means by the fixed coefficient and providing the multiplication result; and an accumulating means for accumulating outputs from the selecting means on byte-by-byte basis.

14. The Reed-Solomon decoder in accordance with claim 13, wherein the delay means is a 8-bit shift register.

15. The Reed-Solomon decoder in accordance with claim 13, wherein the accumulating means comprises:

an adder for adding an output from the selecting means to a previous data; and a register for temporally storing an output from the adder.

* * * * *